United States Patent
Cho et al.

(10) Patent No.: US 10,957,373 B2
(45) Date of Patent: Mar. 23, 2021

(54) SEMICONDUCTOR MEMORY DEVICE

(71) Applicant: SAMSUNG ELECTRONICS CO., LTD., Suwon-si (KR)

(72) Inventors: Keun Hwi Cho, Seoul (KR); Seunghan Park, Gunpo-si (KR); Hyo-Jin Kim, Gunpo-si (KR); Gukil An, Goyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/428,184

(22) Filed: May 31, 2019

(65) Prior Publication Data

US 2020/0013446 A1 Jan. 9, 2020

(30) Foreign Application Priority Data

Jul. 5, 2018 (KR) .................. 10-2018-0078287
Dec. 10, 2018 (KR) .................. 10-2018-0157989

(51) Int. Cl.
*G11C 11/22* (2006.01)
*H01L 29/51* (2006.01)
*H01L 27/11502* (2017.01)

(52) U.S. Cl.
CPC ........ *G11C 11/221* (2013.01); *G11C 11/2255* (2013.01); *G11C 11/2257* (2013.01); *G11C 11/2273* (2013.01); *G11C 11/2275* (2013.01); *G11C 11/2297* (2013.01); *H01L 27/11502* (2013.01); *H01L 29/516* (2013.01)

(58) Field of Classification Search
CPC .............. G11C 11/221; G11C 11/2255; G11C 11/2257; G11C 11/2297

USPC ........................................................ 365/145
See application file for complete search history.

(56) References Cited

U.S. PATENT DOCUMENTS

| | | | |
|---|---|---|---|
| 5,384,731 A | 1/1995 | Kuriyama et al. | |
| 5,390,143 A | 2/1995 | Manning | |
| 5,535,154 A * | 7/1996 | Kiyono ................. | G11C 14/00 257/E27.1 |
| 6,285,577 B1 * | 9/2001 | Nakamura ............. | G11C 11/22 257/E27.104 |
| 6,337,805 B1 * | 1/2002 | Forbes .................. | G11C 11/005 257/E27.104 |
| 6,490,189 B1 * | 12/2002 | Kang .................... | G11C 5/145 365/145 |
| 6,930,344 B2 | 8/2005 | Yokozeki et al. | |

(Continued)

FOREIGN PATENT DOCUMENTS

JP 2005-303111 A 10/2005

*Primary Examiner* — Son L Mai
(74) *Attorney, Agent, or Firm* — Lee IP Law, PC

(57) ABSTRACT

A semiconductor memory device includes a memory cell array including memory cells, a row decoder connected to the memory cell array through first conductive lines, write drivers and sense amplifiers connected to the memory cell array through second conductive lines, a voltage generator that supplies a first voltage to the row decoder and supplies a second voltage to the write drivers and sense amplifiers, and a data buffer that is connected to the write drivers and sense amplifiers and transfers data between the write drivers and sense amplifiers and an external device. At least one of the row decoder, the write drivers and sense amplifiers, the voltage generator, and the data buffer includes a first ferroelectric capacitor to amplify a voltage.

18 Claims, 13 Drawing Sheets

(56) References Cited

U.S. PATENT DOCUMENTS

| | | | |
|---|---|---|---|
| 6,958,947 B2 * | 10/2005 | Park | G11C 5/147 |
| | | | 365/156 |
| 6,980,459 B2 | 12/2005 | Seshadri et al. | |
| 7,307,872 B2 | 12/2007 | Kang et al. | |
| 7,567,451 B2 * | 7/2009 | Koide | G11C 7/065 |
| | | | 365/145 |
| 9,847,109 B2 | 12/2017 | Van Houdt | |
| 2015/0214323 A1 | 7/2015 | Dubourdieu et al. | |
| 2017/0162702 A1 | 6/2017 | Hu | |
| 2018/0122478 A1 | 5/2018 | Morris et al. | |

* cited by examiner

SEMICONDUCTOR MEMORY DEVICE

CROSS-REFERENCE TO RELATED APPLICATIONS

Korean Patent Application Nos. 10-2018-0078287 filed on Jul. 5, 2018 and 10-2018-0157989 filed on Dec. 10, 2018, in the Korean Intellectual Property Office, and entitled: "Semiconductor Memory Device," is incorporated by reference herein in its entirety.

BACKGROUND

1. Field

Embodiments relate to a semiconductor device, and more particularly, relate to a semiconductor memory device which amplifies and uses a voltage through a passive element.

2. Description of the Related Art

Computing devices, e.g., a computer, a smartphone, and a smart pad use a semiconductor memory device as a main storage device or an auxiliary storage device. The main storage device is used for the computing devices to drive various software, e.g., an operating system and an application. The auxiliary storage device is used to preserve original data such as an operating system and an application or user data generated by the operating system and the application.

A semiconductor memory device is one of primary consumers of power in the computing device. In particular, in mobile devices, which use a battery having the limited amount of power, e.g., a smartphone and a smart pad, the amount of power the semiconductor memory device consumes may determine an operating time of mobile devices.

To reduce power consumption of the semiconductor memory device, the semiconductor memory device may be designed to consume a small amount of power. To reduce power consumption, an operating voltage of the semiconductor memory device may be reduced. As the operating voltage of the semiconductor memory device decreases, a swing of the operating voltage of the semiconductor memory device may decrease, thus limiting an operating speed of the semiconductor memory device.

SUMMARY

According to an exemplary embodiment, a semiconductor memory device includes a memory cell array including memory cells, a row decoder connected to the memory cell array through first conductive lines, write drivers and sense amplifiers connected to the memory cell array through second conductive lines, a voltage generator that supplies a first voltage to the row decoder and supplies a second voltage to the write drivers and sense amplifiers, and a data buffer that is connected to the write drivers and sense amplifiers and transfers data between the write drivers and sense amplifiers and an external device. At least one of the row decoder, the write drivers and sense amplifiers, the voltage generator, and the data buffer includes a first ferroelectric capacitor configured to amplify a voltage.

According to an exemplary embodiment, a semiconductor memory device includes a memory cell array including memory cells, a row decoder connected to the memory cell array through first conductive lines, write drivers and sense amplifiers connected to the memory cell array through second conductive lines, a voltage generator that supplies a first voltage to the row decoder and supplies a second voltage to the write drivers and sense amplifiers, and a data buffer that is connected to the write drivers and sense amplifiers and transfers data between the write drivers and sense amplifiers and an external device. Each of the first conductive lines or the second conductive lines includes a ferroelectric capacitor.

According to an exemplary embodiment, a semiconductor memory device includes a memory cell array including memory cells, a row decoder connected to the memory cell array through first conductive lines, write drivers and sense amplifiers connected to the memory cell array through second conductive lines, a voltage generator that supplies a first voltage to the row decoder and supplies a second voltage to the write drivers and sense amplifiers, and a data buffer that is connected to the write drivers and sense amplifiers and transfers data between the write drivers and sense amplifiers and an external device. Each of the memory cells includes a storage element storing at least one bit, and at least one transistor electrically connecting the storage element between two second conductive lines, which are different from each other, from among the second conductive lines depending on a voltage of one of the first conductive lines. A gate insulating layer of the at least one transistor includes a ferroelectric material.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
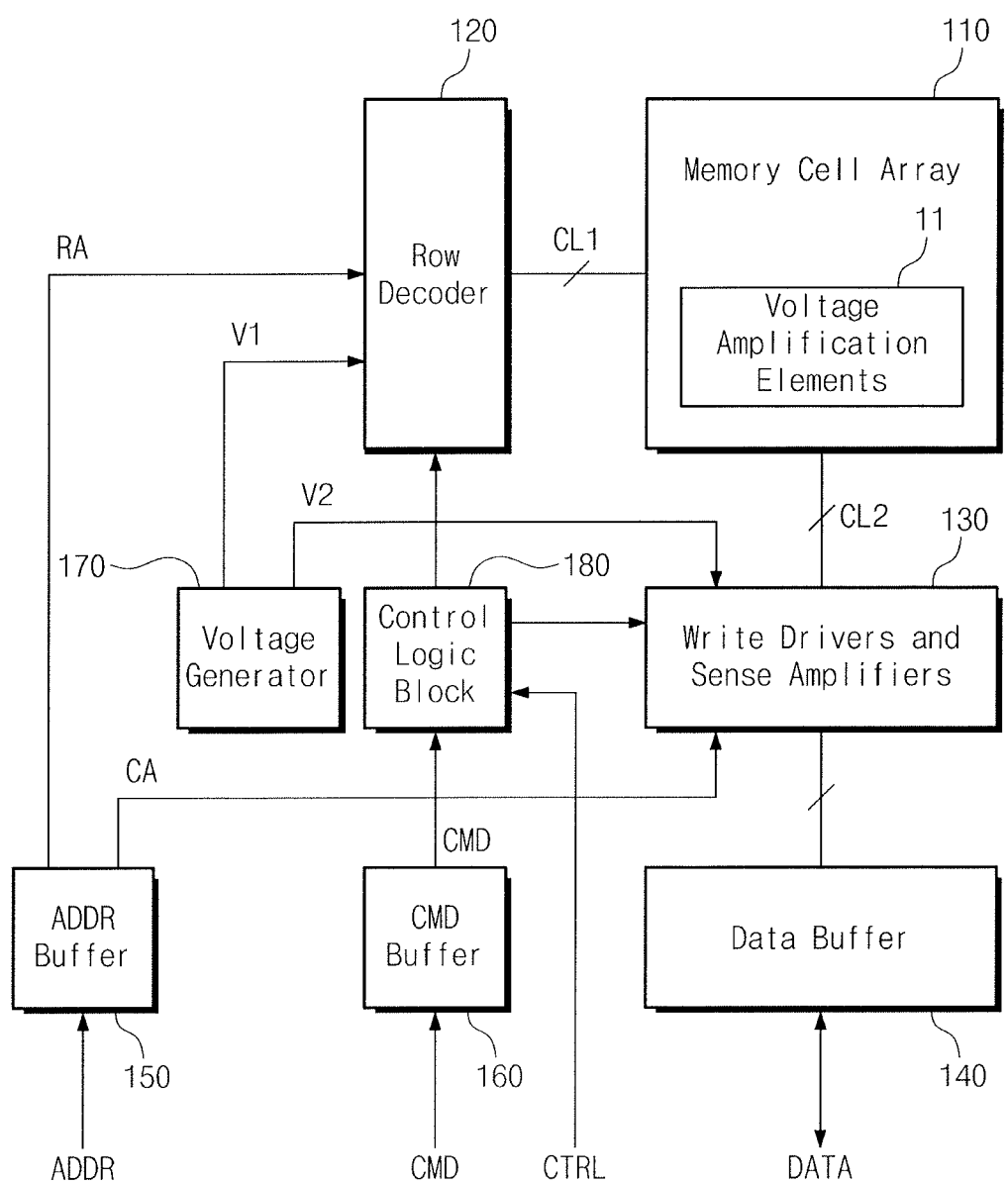
FIG. 1 illustrates a semiconductor memory device according to an embodiment.

FIG. 1 illustrates a semiconductor memory device 100 according to an embodiment. Referring to FIG. 1, the semiconductor memory device 100 includes a memory cell array 110, a row decoder 120, write drivers and sense amplifiers 130, a data buffer 140, an address buffer 150, a command buffer 160, a voltage generator 170, and a control logic block 180.

The memory cell array 110 includes memory cells. The memory cells may be arranged in rows and columns. First conductive lines CL1 may extend along rows of memory cells. Second conductive lines CL2 may extend along columns of memory cells. Each of the memory cells may store one or more bits.

The row decoder 120 is connected to the memory cell array 110 through the first conductive lines CL1. The row decoder 120 may receive a row address RA from the address buffer 150 and may receive first voltages V1 (or first currents) from the voltage generator 170. The row decoder 120 may select a first conductive line connected to memory cells of a row targeted for a read or write operation from the first conductive lines CL1 in response to the row address RA.

The row decoder 120 may apply a selection voltage (or a selection current) of the first voltages V1 (or first currents) to the selected first conductive line and may apply a non-selection voltage (or non-selection current) of the first voltages V1 (or first currents) to unselected first conductive lines. The first conductive lines CL1 are called "word lines".

The write drivers and sense amplifiers 130 are connected to the memory cell array 110 through the second conductive lines CL2. The write drivers and sense amplifiers 130 may receive a column address CA from the address buffer 150 and may receive second voltages V2 (or second currents) from the voltage generator 170.

The write drivers and sense amplifiers 130 may apply second voltages V2 (or second currents) to the second conductive lines CL2 to write data in memory cells of a row selected by the row decoder 120 or to read data from the memory cells of the selected row.

The write drivers and sense amplifiers 130 may perform a read or write operation on memory cells selected by the column address CA among the memory cells of the selected row. The write drivers and sense amplifiers 130 may receive data to be written in the selected memory cells from the data buffer 140. The write drivers and sense amplifiers 130 may transmit data read from the selected memory cells to the data buffer 140.

The data buffer 140 may transmit data "DATA" received from an external device, for example, an external memory controller to the write drivers and sense amplifiers 130. Also, the data buffer 140 may transmit the data "DATA" provided from the write drivers and sense amplifiers 130 to the external device.

The address buffer 150 may receive an address ADDR from the external device, e.g., the external memory controller. The address buffer 150 may transmit the row address RA of the received address ADDR to the row decoder 120. The address buffer 150 may transmit the column address CA of the received address ADDR to the write drivers and sense amplifiers 130.

The command buffer 160 may receive a command CMD from the external device, for example, the external memory controller. The command buffer 160 may transmit the received command CMD to the control logic block 180.

The voltage generator 170 may generate various voltages necessary for the semiconductor memory device 100. For example, the voltage generator 170 may generate the first voltages V1 and may transmit the first voltages V1 to the row decoder 120. The voltage generator 170 may generate the second voltages V2 and may transmit the second voltages V2 to the write drivers and sense amplifiers 130.

The control logic block 180 may receive control signals CTRL from the external device, for example, the external memory controller. The control logic block 180 may receive the command CMD from the command buffer 160. The control logic block 180 may control operations of components of the semiconductor memory device 100 in response to the control signals CTRL and the command CMD.

For example, the control logic block 180 may allow the row decoder 120 to select one first conductive line corresponding to the row address RA among the first conductive lines CL1 at an appropriate timing. The control logic block 180 may allow the write drivers and sense amplifiers 130 to perform a read or write operation on memory cells corresponding to the column address CA among the memory cells of the selected row at an appropriate timing.

The memory cell array 110 according to an embodiment may include voltage amplification elements 11. The voltage amplification elements 11 may amplify and output a received voltage. Each of the voltage amplification elements 11 may be implemented with one passive electrical element. Accordingly, a voltage which is used within the memory cell array 110 may be increased without increasing an operating voltage of the semiconductor memory device 100 and with only a slight increase in complexity.

Figure 2:
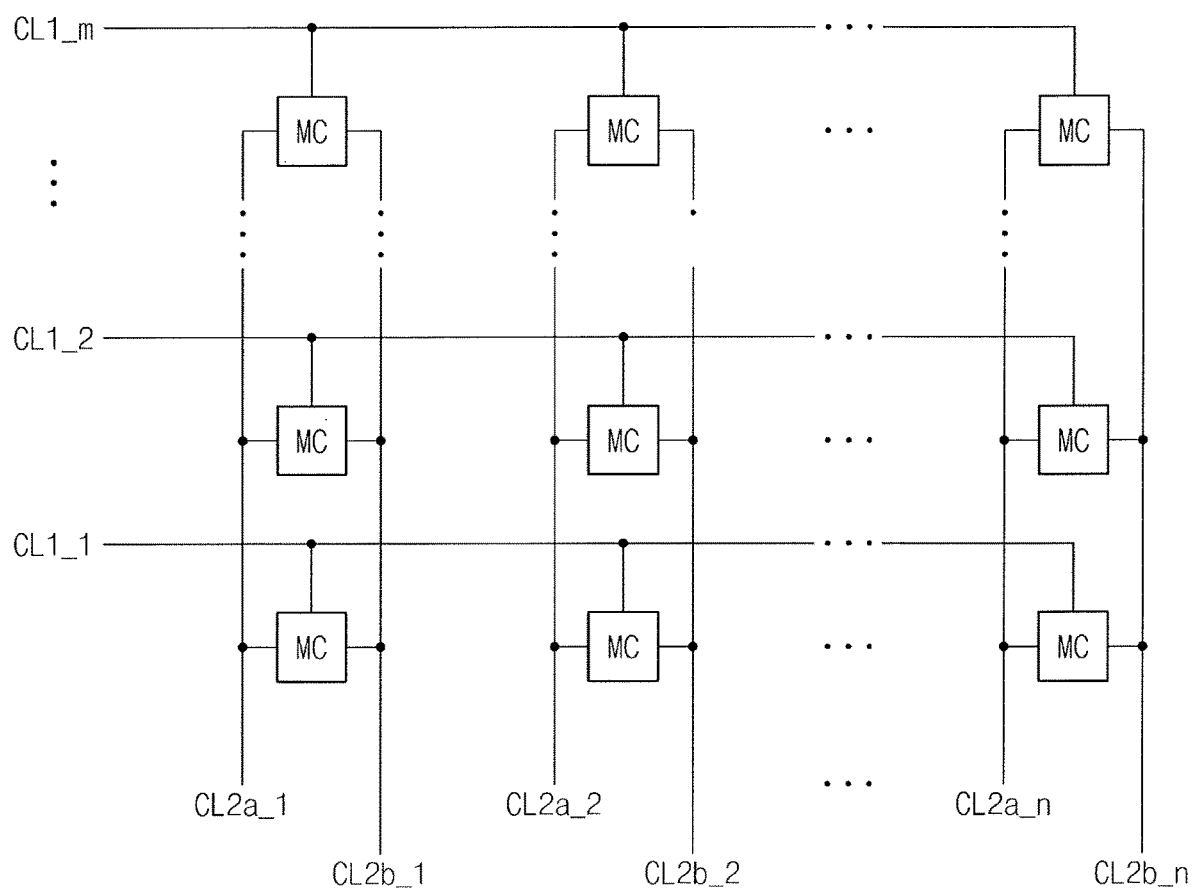
FIG. 2 illustrates a memory cell array according to an embodiment.

FIG. 2 is a diagram illustrating the memory cell array 110 according to an embodiment. Referring to FIGS. 1 and 2, the memory cell array 110 may include memory cells MC arranged in rows and columns. The memory cells MC in the rows may be connected to the first conductive lines CL1, in detail, "m" first conductive lines CL1_1 to CL1_$m$ (m being a positive integer).

The memory cells MC in the columns may be connected to the second conductive lines CL2, in detail, "n" 2$a$-th conductive lines CL2$a$_1 to CL2$a$_$n$ and "n" 2$b$-th conductive lines CL2$b$_1 to CL2$b$_$n$ (n being a positive integer). Each of the memory cells MC may be connected to a first conductive line of the first conductive lines CL1_1 to CL1_$m$, one 2$a$-th conductive line of the 2$a$-th conductive lines CL2$a$_1 to CL2$a$_$n$, and one 2$b$-th conductive line of the 2$b$-th conductive lines CL2$b$_1 to CL2$b$_$n$.

For example, the first conductive lines CL1_1 to CL1_$m$ are called "word lines". The 2$a$-th conductive lines CL2$a$_1 to CL2$a$_$n$ are called "bit lines". The 2$b$-th conductive lines CL2$b$_1 to CL2$b$_$n$ are called "complemented bit lines" or "source lines".

Figure 3:
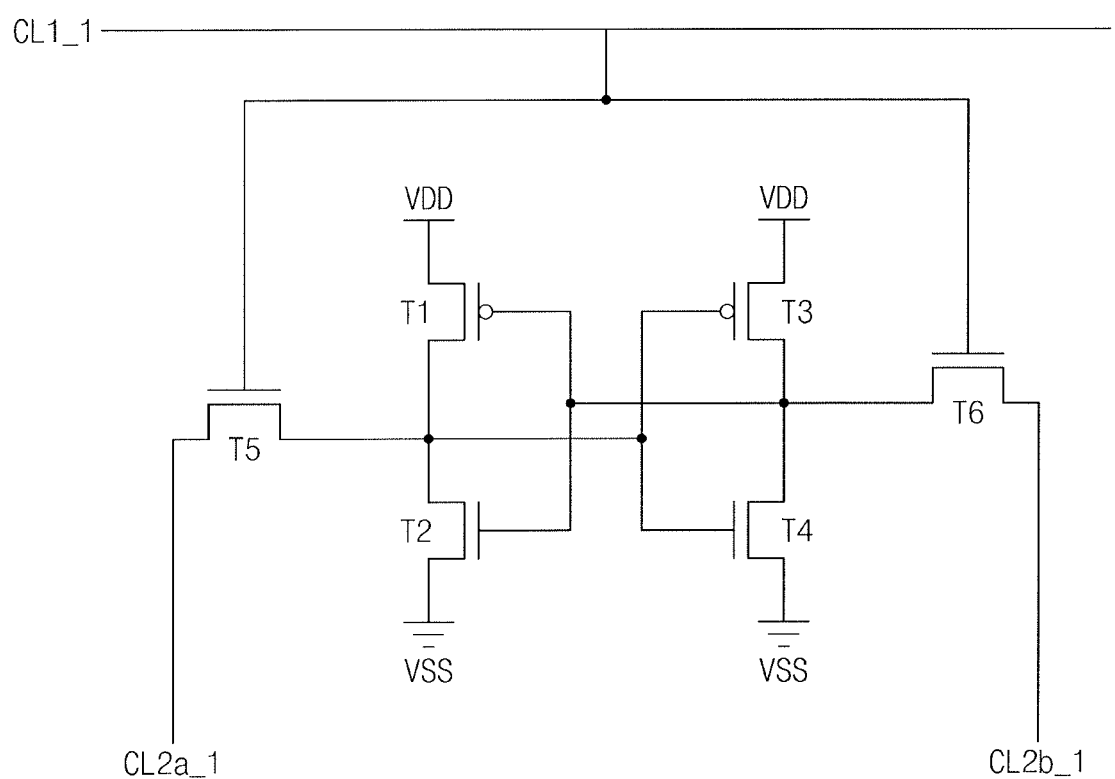
FIG. 3 illustrates a memory cell according to a first embodiment.

FIG. 3 shows a memory cell MC according to a first embodiment. The memory cell MC connected to the first conductive line CL1_1, the 2$a$-th conductive line CL2$a$_1, and the 2$b$-th conductive line CL2$b$_1 is illustrated in FIG. 3.

The memory cell MC may include first to sixth transistors T1 to T6. The first transistor T1 and the second transistor T2 may be serially connected between a power node to which a power supply voltage VDD is supplied and a ground node to which a ground voltage VSS is supplied. The first transistor T1 may be a PMOS transistor, and the second transistor T2 may be an NMOS transistor.

The third transistor T3 and the fourth transistor T4 may be serially connected between the power node to which the power supply voltage VDD is supplied and the ground node to which the ground voltage VSS is supplied. The third transistor T3 may be a PMOS transistor, and the fourth transistor T4 may be an NMOS transistor.

The fifth transistor T5 may be connected between gates of the third and fourth transistors T3 and T4 and the 2$a$-th conductive line CL2a_1. A gate of the fifth transistor T5 may be connected to the first conductive line CL1_1. The fifth transistor T5 may be an NMOS transistor.

The sixth transistor T6 may be connected between gates of the first and second transistors T1 and T2 and the 2b-th conductive line CL2b_1. A gate of the sixth transistor T6 may be connected to the first conductive line CL1_1. The sixth transistor T6 may be an NMOS transistor.

The first to fourth transistors T1 to T4 may function as cross-coupled inverters. The first to fourth transistors T1 to T4 may function as a storage element storing data in the memory cell MC. The fifth and sixth transistors T5 and T6 may function as a selection element which electrically connects the storage element between the 2a-th conductive line CL2a_1 and the 2b-th conductive line CL2b_1.

The memory cell MC may be a static random access memory (SRAM) cell. An example of the 6 transistor (6T) SRAM cell is illustrated in FIG. 3. In an implementation, the memory cell MC may be implemented with various shapes of SRAM cells.

The first to sixth transistors T1 to T6 may be the voltage amplification elements 11, respectively. For example, each of the first to sixth transistors T1 to T6 may amplify a voltage applied to a gate thereof and may transmit the amplified voltage to a body. The first to sixth transistors T1 to T6 may perform voltage amplification by using a passive element. When the voltage transmitted to body is amplified, since a response speed of the first to sixth transistors T1 to T6 is improved, the memory cell MC may be accessed more quickly.

Figure 4:
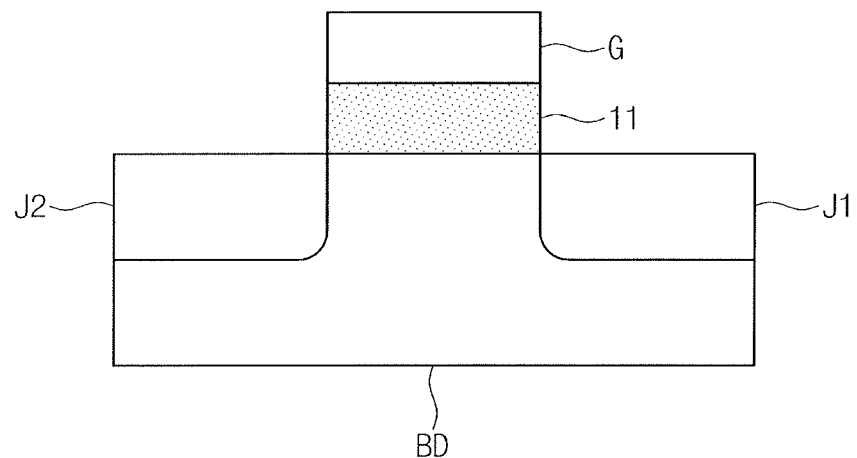
FIG. 4 illustrates a transistor according to an embodiment.

FIG. 4 illustrates a transistor according to an embodiment. In an embodiment, a transistor "T" may be one of the first to sixth transistors T1 to T6 of FIG. 3. Referring to FIGS. 3 and 4, the transistor "T" may include a gate electrode "G", a body BD, a first junction J1 and a second junction J2 formed in the body BD, and the voltage amplification element 11 between the body BD and the gate electrode "G".

The gate electrode "G" may function as a gate of the transistor "T". The first junction J1 and the second junction J2 may function as a drain and a source of the transistor "T". When the transistor "T" is an NMOS transistor, the body BD may be doped with p-type impurities, and the first junction J1 and the second junction J2 may be doped with N-type impurities. When the transistor "T" is a PMOS transistor, the body BD may be doped with n-type impurities, and the first junction J1 and the second junction J2 may be doped with p-type impurities.

The voltage amplification element 11 may function as an insulating layer between the gate electrode "G" and the body BD. Also, the voltage amplification element 11 may amplify a voltage applied to the gate electrode "G" and may transfer the amplified voltage onto a surface of the body BD. The voltage amplification element 11 may include a ferroelectric material.

The ferroelectric material may be characterized in that a voltage applied to one end is amplified and is transferred to an opposite end regardless of its own state (e.g., an electrical polarization state). This characteristic is called a "negative capacitor". For example, when an external voltage is applied to a ferroelectric layer, dipoles in the ferroelectric layer may move, and thus, a phase may change from an initial polarity state to another state. This phase change may cause a negative capacitance effect.

As described with reference to FIG. 4, when gate insulating layers of the first to sixth transistors T1 to T6 of FIG. 3 are formed of a ferroelectric material, each of the first to sixth transistors T1 to T6 amplifies a gate voltage and transfers the amplified voltage to the body BD. Accordingly, a response speed of the selection element and the storage element of the memory cell MC may become higher, and thus, a speed to access the memory cell MC may be improved.

In an embodiment, the voltage amplification element 11 may include HfO doped with at least one of Zr, Si, Al, La, and the like. When at least one of Zr, Si, Al, La, and the like is used at a given ratio to dope HfO, the voltage amplification element 11 may have an orthorhombic crystal structure. The negative capacitance effect may occur when a ferroelectric layer has the orthorhombic crystal structure.

When the voltage amplification element 11 includes ZrHfO, the atomic ratio (Zr/(Hf+Zr)) of Zr atoms to total atoms may be 45 at. % to 55 at. %. When the voltage amplification element 11 includes SiHfO, the atomic ratio (Si/(Hf+Si)) of Si atoms to total atoms may be 4 at. % to 7 at. %. When the voltage amplification element 11 includes AlHfO, the atomic ratio (Al/(Hf+Al)) of Al atoms to total atoms may be 4 at. % to 7 at. %. In the case where the voltage amplification element 11 includes LaHfO, the atomic ratio (La/(La+Al)) of La atoms to total atoms may be 5 at. % to 10 at. %.

Figure 5:
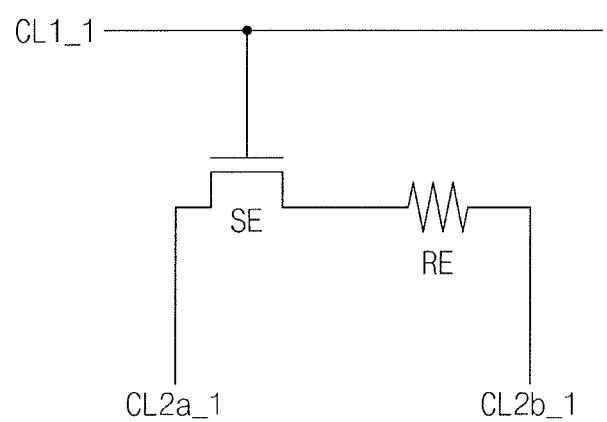
FIG. 5 illustrates a memory cell according to a second embodiment.

FIG. 5 illustrates a memory cell MC according to a second embodiment. The memory cell MC connected to the first conductive line CL1_1, the 2a-th conductive line CL2a_1, and the 2b-th conductive line CL2b_1 is illustrated in FIG. 5.

The memory cell MC may include a selection element SE and a variable resistance element RE functioning as a storage element. The selection element SE may include a transistor connected between the variable resistance element RE and the 2a-th conductive line CL2a_1 and is controlled by a voltage of the first conductive line CL1_1.

The variable resistance element RE may be connected between the selection element SE and the 2b-th conductive line CL2b_1. The variable resistance element RE may have a resistance value that varies with a voltage applied to the variable resistance element RE or a current flowing through the variable resistance element RE. Data may be stored in the variable resistance element RE by adjusting a resistance value of the variable resistance element RE. Data written in the variable resistance element RE may be read by detecting a resistance value of the variable resistance element RE.

For example, the variable resistance element RE may include at least one of a phase change material, a ferroelectric material, a resistive material, and a magnetic material. The phase change material may have different crystalline structures depending on a temperature and may have different resistance values depending on a crystalline structure. The ferroelectric material may have different electrical polarization states depending on a magnetic field or an electric field and may have different resistance values depending on polarization states. A resistance material may selectively form an electrical path depending on a voltage and may have different resistance values depending on whether an electrical path is formed. A magnetic material may have magnetization directions which vary with a magnetic field or a flow of a current and may have different resistance values depending on the magnetization directions.

A transistor of the selection element SE may be implemented identically to the transistor described with reference to FIG. 4. For example, a gate insulating layer of the transistor of the selection element SE may include a ferroelectric material. The transistor of the selection element SE may be implemented to include the voltage amplification element 11 which amplifies a gate voltage and transfers the amplified voltage to the body BD (refer to FIG. 4).

Figure 6:
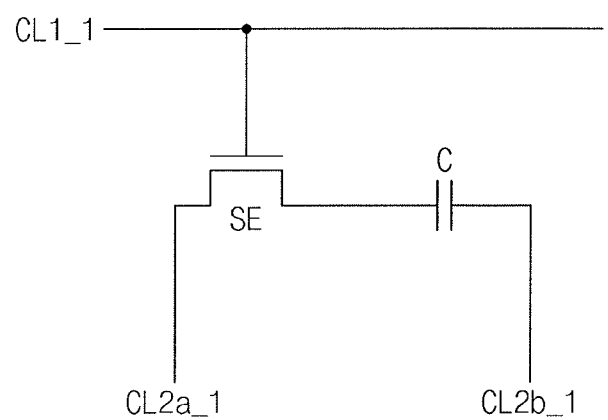
FIG. 6 illustrates a memory cell according to a third embodiment.

FIG. 6 illustrates a memory cell MC according to a third embodiment. The memory cell MC connected to the first conductive line CL1_1, the 2a-th conductive line CL2a_1, and the 2b-th conductive line CL2b_1 is illustrated in FIG. 6.

The memory cell MC may include the selection element SE and a capacitor "C" functioning as a storage element. The selection element SE may include a transistor connected between the capacitor "C" and the 2a-th conductive line CL2a_1 and is controlled by a voltage of the first conductive line CL1_1. The capacitor "C" may store data by charging or discharging a voltage. The memory cell MC may be a dynamic random access memory (DRAM) cell.

A transistor of the selection element SE may be implemented identically to the transistor described with reference to FIG. 4. For example, a gate insulating layer of the transistor of the selection element SE may include a ferroelectric material. The transistor of the selection element SE may be implemented to include the voltage amplification element 11 which amplifies a gate voltage and transfers the amplified voltage to the body BD (refer to FIG. 4).

Figure 7:
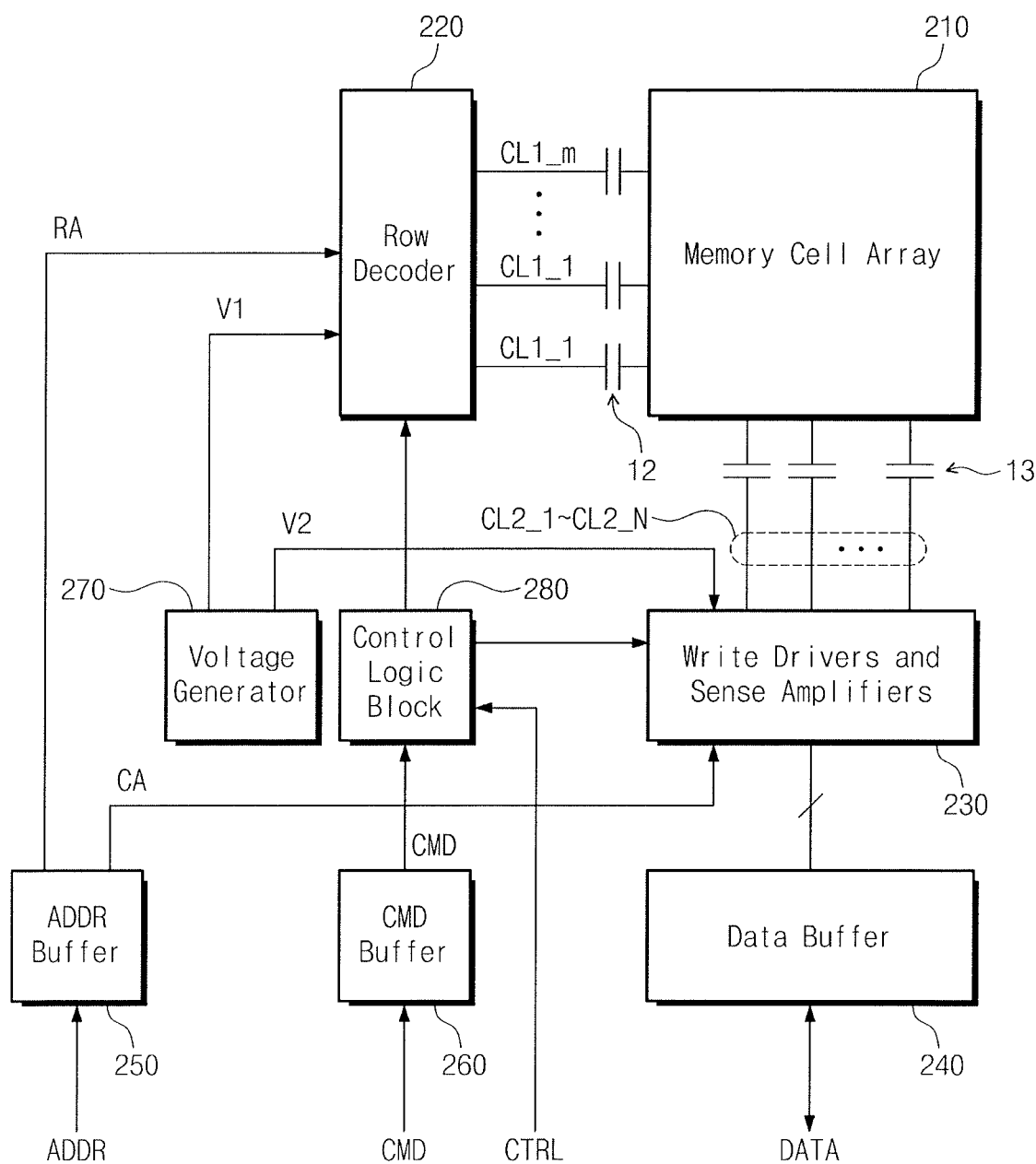
FIG. 7 illustrates a semiconductor memory device according to another embodiment.

FIG. 7 illustrates a semiconductor memory device 200 according to another embodiment. Referring to FIG. 7, the semiconductor memory device 200 includes a memory cell array 210, a row decoder 220, write drivers and sense amplifiers 230, a data buffer 240, an address buffer 250, a command buffer 260, a voltage generator 270, and a control logic block 280.

The memory cell array 210 may be implemented as described with reference to FIGS. 2 and 3 and FIG. 5 or 6. Each of the memory cells MC of the memory cell array 210 may be implemented to include the voltage amplification element 11 as described with reference to FIG. 4. For another example, each of the memory cells MC of the memory cell array 210 may be implemented not to include the voltage amplification element 11. A gate insulating layer of a transistor of each memory cell MC may be implemented with a general insulating layer or a paraelectric material.

The row decoder 220, the write drivers and sense amplifiers 230, the data buffer 240, the address buffer 250, the command buffer 260, the voltage generator 270, and the control logic block 280 may be implemented to be identical to the row decoder 120, the write drivers and sense amplifiers 130, the data buffer 140, the address buffer 150, the command buffer 160, the voltage generator 170, and the control logic block 180 described with reference to FIG. 1.

The row decoder 220 may be connected to the memory cell array 210 through the first conductive lines CL1_1 to CL1_$m$. Each of the first conductive lines CL1_1 to CL1_$m$ may include voltage amplification elements 12. The voltage amplification elements 12 may be implemented in the form of a capacitor (e.g., a ferroelectric capacitor) including a ferroelectric material.

When the first conductive lines CL1_1 to CL1_$m$ include the voltage amplification elements 12, voltages which the row decoder 220 applies to the first conductive lines CL1_1 to CL1_$m$ may be amplified and may be transferred to the memory cell array 210. In particular, the memory cells MC may be formed on a substrate and have a size limitation.

In contrast, the first conductive lines CL1_1 to CL1_$m$ are formed in various layers including metal layers and a size limitation on the first conductive lines CL1_1 to CL1_$m$ is less than that of the memory cells MC. Accordingly, the voltage amplification elements 12 formed at the first conductive lines CL1_1 to CL1_$m$ may be manufactured to be larger than the voltage amplification elements 11 of the memory cells MC. Accordingly, an amplification factor of the voltage amplification elements 12 of the first conductive lines CL1_1 to CL1_$m$ may be greater than an amplification factor of the voltage amplification elements 11 of the memory cells MC.

The write drivers and sense amplifiers 230 may be connected to the memory cell array 210 through the second conductive lines CL2_1 to CL2_$n$. Each of the second conductive lines CL2_1 to CL2_$n$ may be implemented with a pair of 2a-th and 2b-th conductive lines. Each of the second conductive lines CL2_1 to CL2_$n$ may include voltage amplification elements 13. The voltage amplification elements 13 may be implemented in the form of a capacitor (e.g., a ferroelectric capacitor) including a ferroelectric material.

Like the voltage amplification elements 12 of the first conductive lines CL1_1 to CL1_$m$, an amplification factor of the voltage amplification elements 13 of the second conductive lines CL2_1 to CL2_$n$ may be greater than an amplification factor of the voltage amplification elements 11 of the memory cells MC. In an embodiment, the semiconductor memory device 200 may be implemented such that the voltage amplification elements 12 are only on the first conductive lines CL1_1 to CL1_$m$ or the voltage amplification elements 13 are only on the second conductive lines CL2_1 to CL2_$n$.

Figure 8:
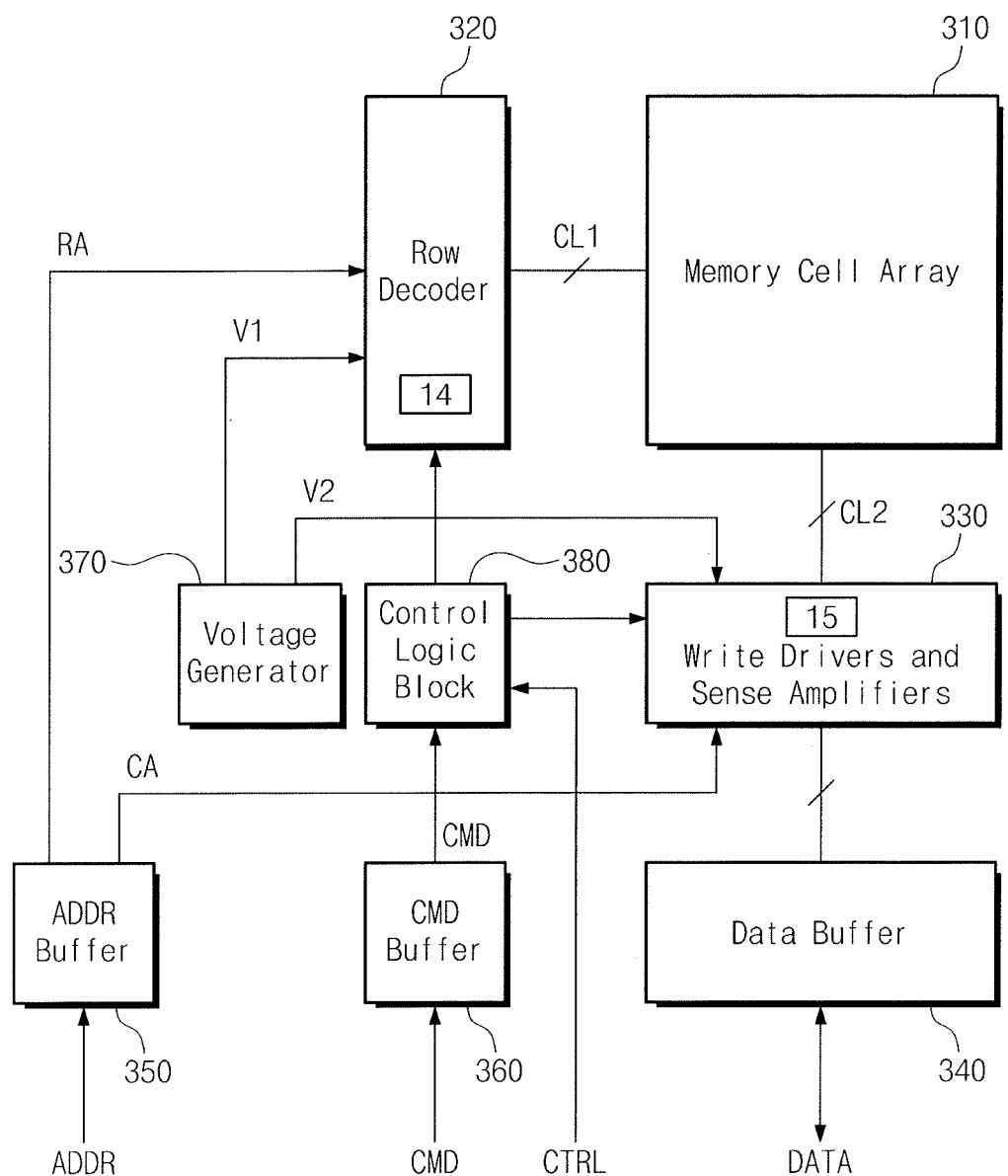
FIG. 8 illustrates a semiconductor memory device according to another embodiment.

FIG. 8 illustrates a semiconductor memory device 300 according to another embodiment. Referring to FIG. 8, the semiconductor memory device 300 includes a memory cell array 310, a row decoder 320, write drivers and sense amplifiers 330, a data buffer 340, an address buffer 350, a command buffer 360, a voltage generator 370, and a control logic block 380.

The memory cell array 310 may be implemented as described with reference to FIGS. 2 and 3 and FIG. 5 or 6. Each of the memory cells MC of the memory cell array 310 may be implemented to include the voltage amplification element 11 as described with reference to FIG. 4. For another example, each of the memory cells MC of the memory cell array 310 may be implemented not to include the voltage amplification element 11. A gate insulating layer of a transistor of each memory cell MC may be implemented with a general insulating layer or a paraelectric material.

The first conductive lines CL1_$m$ ay be implemented to include the voltage amplification elements 12 as described with reference to FIG. 7. The second conductive lines CL2 may be implemented to include the voltage amplification elements 13 as described with reference to FIG. 7.

The row decoder 320, the write drivers and sense amplifiers 330, the data buffer 340, the address buffer 350, the command buffer 360, the voltage generator 370, and the control logic block 380 may be implemented to be identical to the row decoder 120, the write drivers and sense amplifiers 130, the data buffer 140, the address buffer 150, the command buffer 160, the voltage generator 170, and the control logic block 180 described with reference to FIG. 1.

The row decoder 320 may include voltage amplification elements 14 in addition to the row decoder 120 described with reference to FIG. 1. The write drivers and sense amplifiers 330 may include voltage amplification elements 15 in addition to the write drivers and sense amplifiers 130 described with reference to FIG. 1.

Figure 9:
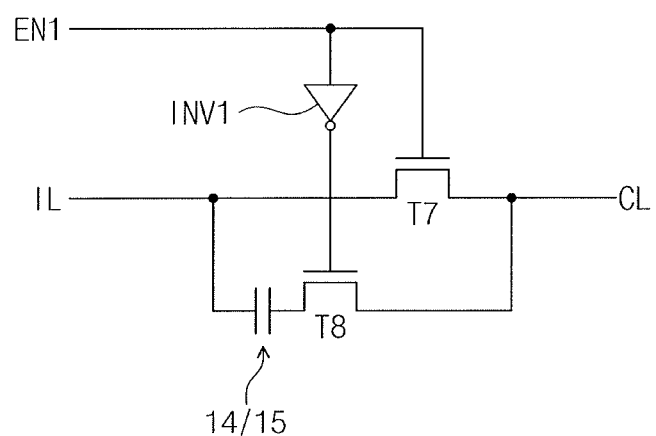
FIG. 9 illustrates an example of components associated with voltage amplification elements implemented in a row decoder or write drivers and sense amplifiers.

FIG. 9 illustrates an example of components associated with the voltage amplification elements 14 or 15 implemented in the row decoder 320 or the write drivers and sense amplifiers 330. Referring to FIGS. 8 and 9, the row decoder 320 or the write drivers and sense amplifiers 330 may include a seventh transistor T7, an eighth transistor T8, a first inverter INV1, and the voltage amplification element 14 or 15.

The seventh transistor T7 may electrically connect an internal line IL of the row decoder 320 or the write drivers and sense amplifiers 330 and a conductive line CL (e.g., a first conductive line or a second conductive line) in response to a first enable signal EN1. The eighth transistor T8 may connect the internal line IL with the conductive line CL through the voltage amplification element 14 or 15 in response to a signal corresponding to an output of the first inverter INV1 to which the first enable signal EN1 is input.

When the seventh transistor T7 is turned on, a voltage of the internal line IL may be transferred to the conductive line CL without passing through the voltage amplification element 14 or 15. When the eighth transistor 18 is turned on, a voltage of the internal line IL may be amplified by the voltage amplification element 14 or 15 and may be transferred to the conductive line CL.

An example in which the row decoder 320 or the write drivers and sense amplifiers 330 use the voltage amplification elements 14 or 15 to selectively amplify a voltage of the internal line IL to selectively apply the amplified voltage to the conductive line CL is described with reference to FIG. 9. In an implementation, gate insulating layers of transistors constituting an operator such as the first inverter INV1 may be implemented to include a ferroelectric material as described with reference to FIG. 4. Alternatively, ferroelectric capacitors may be arranged at a given interval at a wire through which a voltage is transferred. Alternatively, ferroelectric capacitors may be arranged at wires through which signals are transferred between particular combinational logics.

Figure 10:
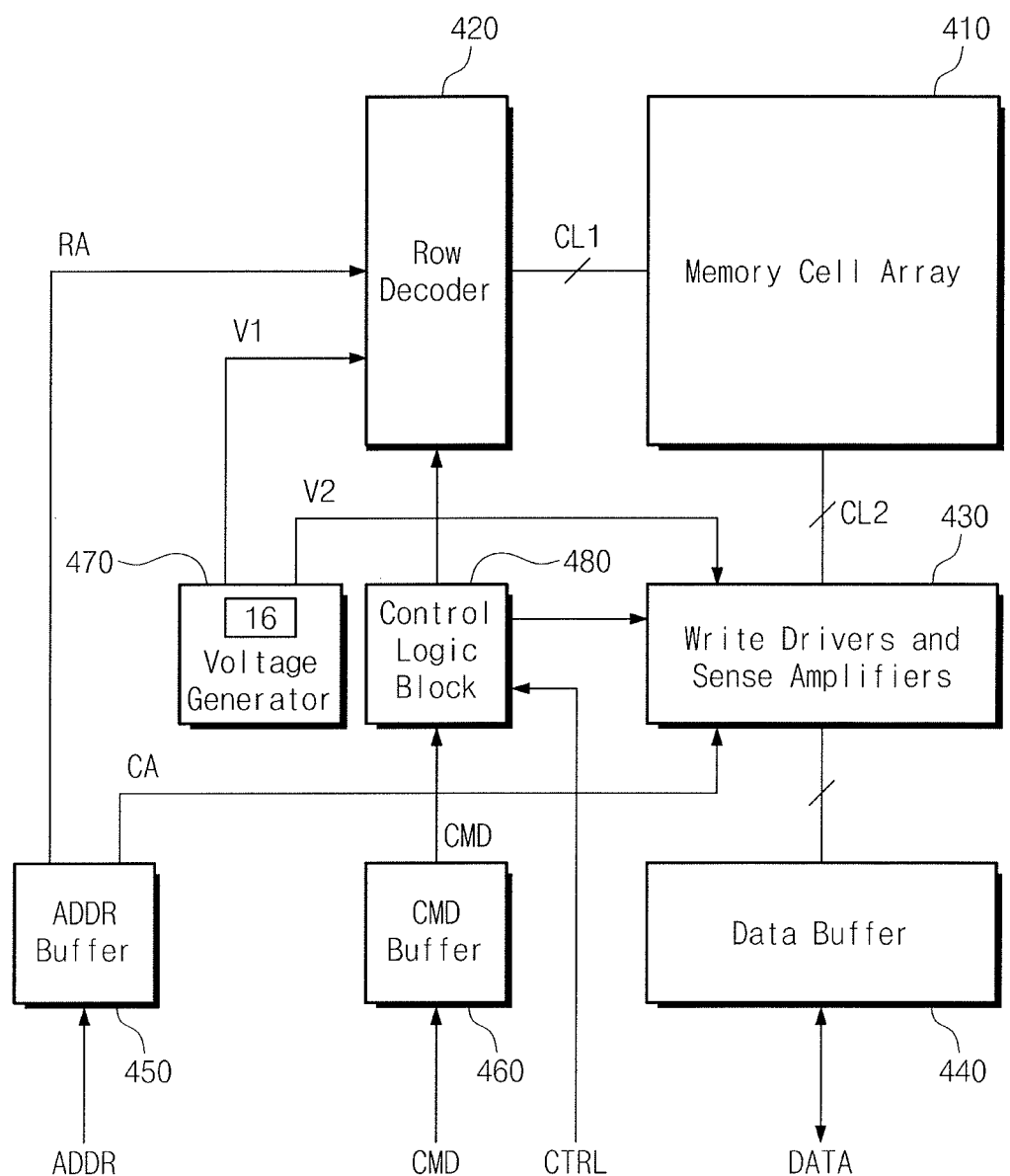
FIG. 10 illustrates a semiconductor memory device according to another embodiment.

FIG. 10 illustrates a semiconductor memory device 400 according to another embodiment. Referring to FIG. 10, the semiconductor memory device 400 includes a memory cell array 410, a row decoder 420, write drivers and sense amplifiers 430, a data buffer 440, an address buffer 450, a command buffer 460, a voltage generator 470, and a control logic block 480.

The memory cell array 410 may be implemented as described with reference to FIGS. 2 and 3 and FIG. 5 or 6. Each of the memory cells MC of the memory cell array 410 may be implemented to include the voltage amplification element 11 as described with reference to FIG. 4. For another example, each of the memory cells MC of the memory cell array 410 may be implemented not to include the voltage amplification element 11. A gate insulating layer of a transistor of each memory cell MC may be implemented with a general insulating layer or a paraelectric material.

The first conductive lines CL1_m ay be implemented to include the voltage amplification elements 12 as described with reference to FIG. 7. The second conductive lines CL2 may be implemented to include the voltage amplification elements 13 as described with reference to FIG. 7.

The row decoder 420, the write drivers and sense amplifiers 430, the data buffer 440, the address buffer 450, the command buffer 460, the voltage generator 470, and the control logic block 480 may be implemented to be identical to the row decoder 120, the write drivers and sense amplifiers 130, the data buffer 140, the address buffer 150, the command buffer 160, the voltage generator 170, and the control logic block 180 described with reference to FIG. 1.

The row decoder 420 or the write drivers and sense amplifiers 430 may be implemented to include the voltage amplification elements 14 or 15 as described with reference to FIG. 8 or 9. The voltage generator 470 may further include voltage amplification elements 16 in addition to the voltage generator 170 described with reference to FIG. 1.

Figure 11:
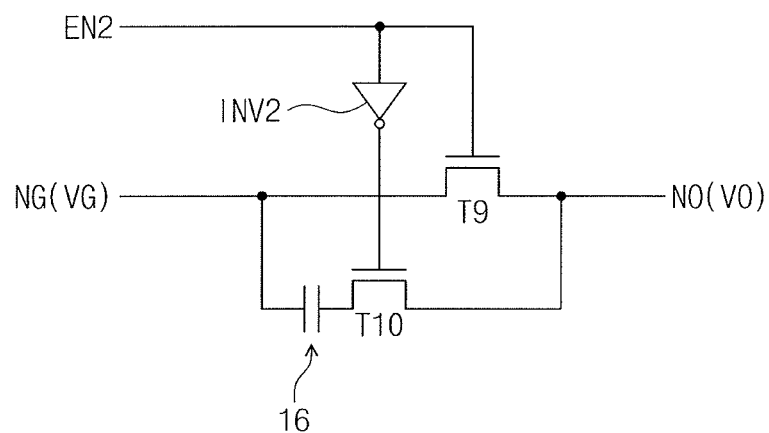
FIG. 11 illustrates an example of components associated with voltage amplification elements implemented in a voltage generator.

FIG. 11 illustrates an example of components associated with the voltage amplification elements 16 implemented in the voltage generator 470. Referring to FIGS. 10 and 11, the voltage generator 470 includes a ninth transistor T9, a tenth transistor T10, a second inverter INV2, and the voltage amplification element 16.

The ninth transistor T9 may electrically connect a generation node NG, from which a generation voltage VG of the voltage generator 470 is output, with an output node NO, from which an output voltage VO of the voltage generator 470 is output, in response to a second enable signal EN2. The tenth transistor T10 may connect the generation node NG with the output node NO through the voltage amplification element 16 in response to a signal corresponding to an output of the second inverter INV2 to which the second enable signal EN2 is input.

When the ninth transistor T9 is turned on, the generation voltage VG of the generation node NG may be output through the output node NO as the output voltage VO without passing through the voltage amplification element 16. When the tenth transistor T10 is turned on, the generation voltage VG of the generation node NG may be amplified by the voltage amplification element 16 and may be output through the output node NO as the output voltage VO.

The output voltage VO may be output as one of the first voltages V1 or the second voltages V2. In an embodiment, the components illustrated in FIG. 11 may be provided for each of the first and second voltages V1 and V2.

An example in which the voltage generator 470 uses the voltage amplification elements 16 to selectively amplify the output voltage VO is described with reference to FIG. 11. In an implementation, gate insulating layers of transistors constituting an operator such as the second inverter INV2 may be implemented to include a ferroelectric material as described with reference to FIG. 4. Alternatively, ferroelectric capacitors may be arranged at a given interval at a wire through which a voltage is transferred. Alternatively, ferroelectric capacitors may be arranged at wires through which signals are transferred between particular combinational logics.

Figure 12:
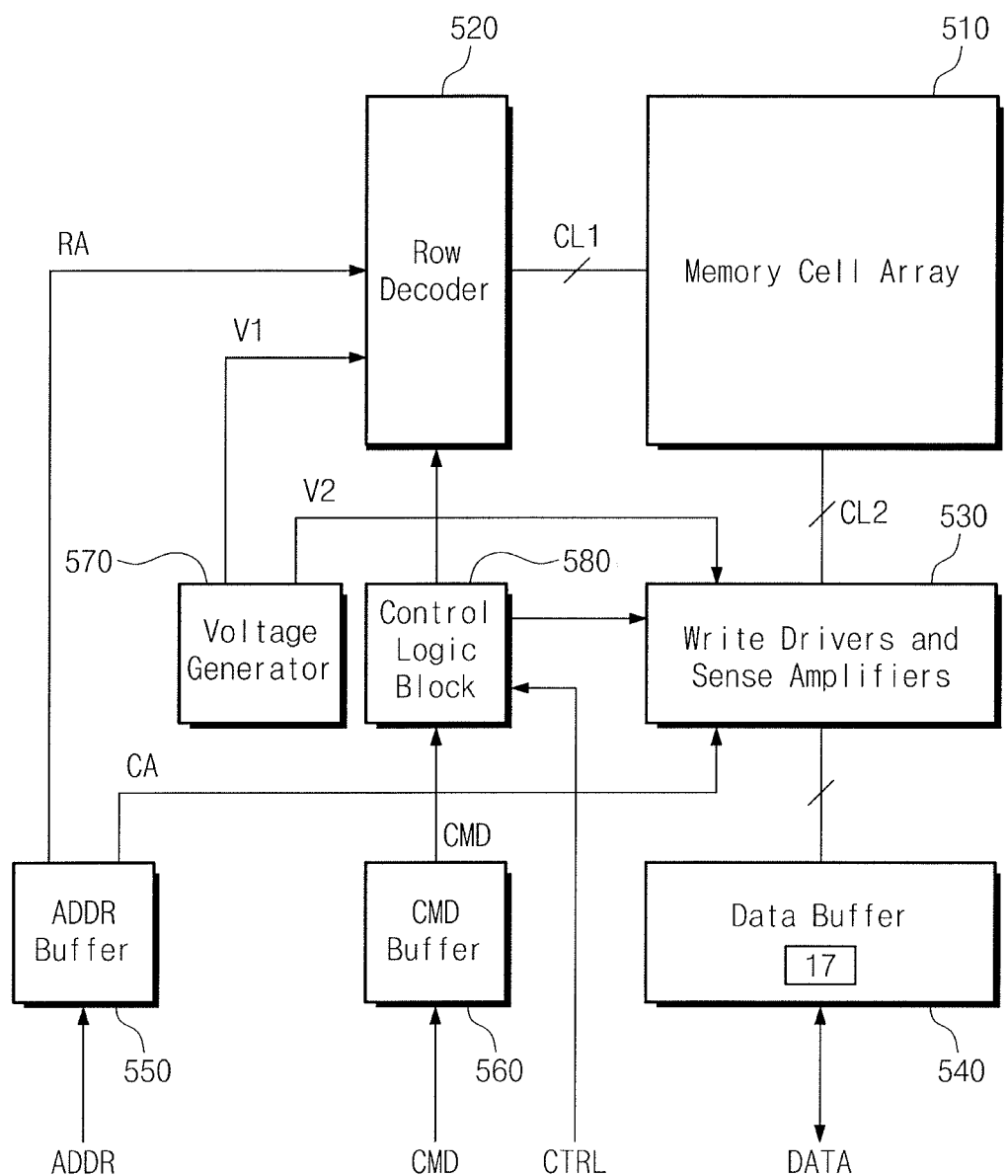
FIG. 12 illustrates a semiconductor memory device according to another embodiment.

FIG. 12 illustrates a semiconductor memory device 500 according to another embodiment. Referring to FIG. 12, the semiconductor memory device 500 includes a memory cell array 510, a row decoder 520, write drivers and sense amplifiers 530, a data buffer 540, an address buffer 550, a command buffer 560, a voltage generator 570, and a control logic block 580.

The memory cell array 510 may be implemented as described with reference to FIGS. 2 and 3 and FIG. 5 or 6. Each of the memory cells MC of the memory cell array 510 may be implemented to include the voltage amplification element 11 as described with reference to FIG. 4. For another example, each of the memory cells MC of the memory cell array 510 may be implemented not to include the voltage amplification element 11. A gate insulating layer of a transistor of each memory cell MC may be implemented with a general insulating layer or a paraelectric material.

The first conductive lines CL1_m ay be implemented to include the voltage amplification elements 12 as described with reference to FIG. 7. The second conductive lines CL2 may be implemented to include the voltage amplification elements 13 as described with reference to FIG. 7.

The row decoder 520, the write drivers and sense amplifiers 530, the data buffer 540, the address buffer 550, the command buffer 560, the voltage generator 570, and the control logic block 580 may be implemented to be identical to the row decoder 120, the write drivers and sense amplifiers 130, the data buffer 140, the address buffer 150, the command buffer 160, the voltage generator 170, and the control logic block 180 described with reference to FIG. 1.

The row decoder 520 or the write drivers and sense amplifiers 530 may be implemented to include the voltage amplification elements 14 or 15 as described with reference to FIG. 8 or 9. The voltage generator 570 may be implemented to include the voltage amplification elements 16 as described with reference to FIG. 11. The data buffer 540 may be implemented to include voltage amplification elements 17 in addition to the data buffer 140 described with reference to FIG. 1.

Figure 13:
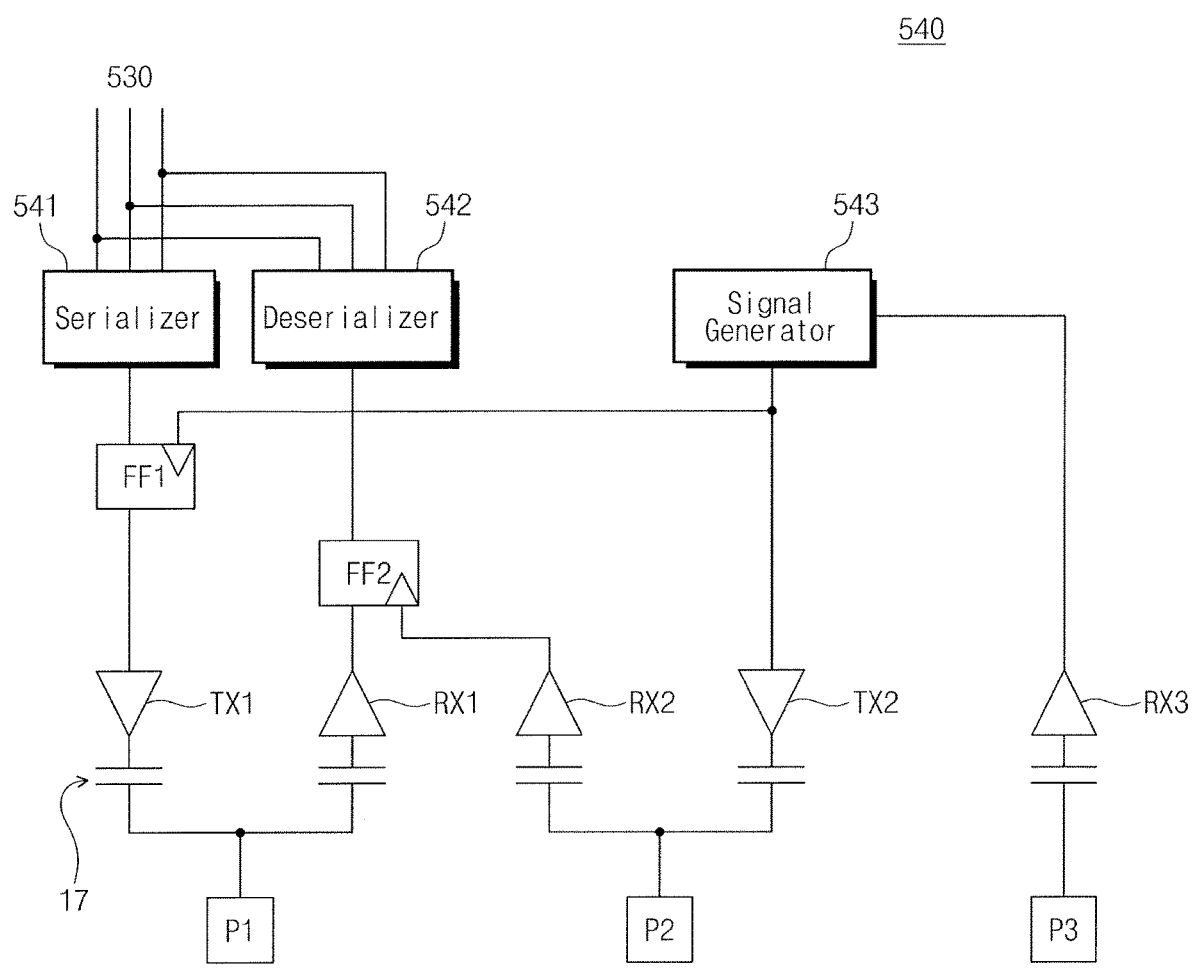
FIG. 13 illustrates an example of components associated with voltage amplification elements implemented in a data buffer.

FIG. 13 illustrates an example of components associated with the voltage amplification elements 17 implemented in the data buffer 540. Referring to FIGS. 12 and 13, the data buffer 540 includes a serializer 541, a deserializer 542, the voltage amplification elements 17, first to third pads P1 to P3, first and second transmitters TX1 and TX2, first and second flip-flops FF1 and FF2, and a signal generator 543.

The serializer 541 may serialize signals (e.g., bits) transferred from the write drivers and sense amplifiers 530 so as to be transferred to the first flip-flop FF1. The deserializer 542 may deserialize signals (e.g., bits) transferred from the second flip-flop FF2 so as to be transferred to the write drivers and sense amplifiers 530.

The first flip-flop FF1 may transfer output signals of the serializer 541 to the first transmitter TX1 in synchronization with an output signal of the signal generator 543. The first transmitter TX1 may output an output signal of the first flip-flop FF1 to the first pad P1 through the voltage amplification element 17. The first pad P1 may be connected with an external device, e.g., an external memory controller.

The first receiver RX1 may transfer a signal transferred through the voltage amplification element 17 from the first pad P1 to the second flip-flop FF2. The second flip-flop FF2 may transfer an output signal of the first receiver RX1 to the deserializer 542 in synchronization with an output signal of the second receiver RX2.

The second receiver RX2 may receive a signal through the voltage amplification element 17 from the second pad P2. An output signal of the second receiver RX2 may be transferred to a clock input of the second flip-flop FF2. The second transmitter TX2 may output the output signal of the signal generator 543 to the second pad P2 through the voltage amplification element 17. The second pad P2 may be connected with the external device, for example, the external memory controller.

The third receiver RX3 may receive a signal through the voltage amplification element 17 from the third pad P3. An output signal of the third receiver RX3 is transferred to the signal generator 543. The third pad P3 may be connected with the external device, for example, the external memory controller.

The signal generator 543 may generate a timing signal (e.g., a toggle signal or a strobe signal), which informs operating timings while transitioning between a low level and a high level, from the output signal of the third receiver RX3. The output signal of the signal generator 543 may be transferred to the clock input of the first flip-flop FF1 and the second transmitter TX2.

For example, the third pad P3 may be configured to allow the data buffer 540 to receive a timing signal from the external device. A signal received through the third pad P3 is called a "data strobe signal" or a "clock signal". The signal of the third pad P3 may be used for the signal generator 543 to generate another timing signal, for example, another data strobe signal.

The second pad P2 may be configured for the data buffer 540 to convey a timing signal, for example, a data strobe signal at a data input cycle or a data output cycle. At the data input cycle, a data strobe signal may be received from the second pad P2 through the voltage amplification element 17 and the second receiver RX2. The second flip-flop FF2 may identify a data signal transferred through the voltage amplification element 17 and the first receiver RX1 from the first pad P1 in synchronization with a data strobe signal. At a data output cycle, the data strobe signal generated by the signal generator 543 may be output to the second pad P2 through the second transmitter TX2 and the voltage amplification element 17. The first flip-flop FF1 may output a data signal to the first pad P1 through the first transmitter TX1 and the voltage amplification element 17 in synchronization with the data strobe signal.

As illustrated in FIG. 13; signals input to the data buffer 540 are transferred through the voltage amplification elements 17. Also, signals output from the data buffer 540 are output through the voltage amplification elements 17. Accordingly, a strength of a signal which the data buffer 540 exchanges with the external device, for example, the external memory controller is improved, thus making the integrity of data better.

An example in which the data buffer 540 uses the voltage amplification elements 17 to selectively amplify signals exchanged with the external device is described with reference to FIG. 13. However, the use of the voltage amplification elements 17 is not limited thereto. For example, gate insulating layers of transistors constituting operators such as an inverter and a logic gate may be implemented to include a ferroelectric material as described with reference to FIG. 4. Alternatively, ferroelectric capacitors may be arranged at a given interval at a wire through which a voltage is transferred. Alternatively, ferroelectric capacitors may be arranged at wires through which signals are transferred between particular combinational logics.

Figure 14:
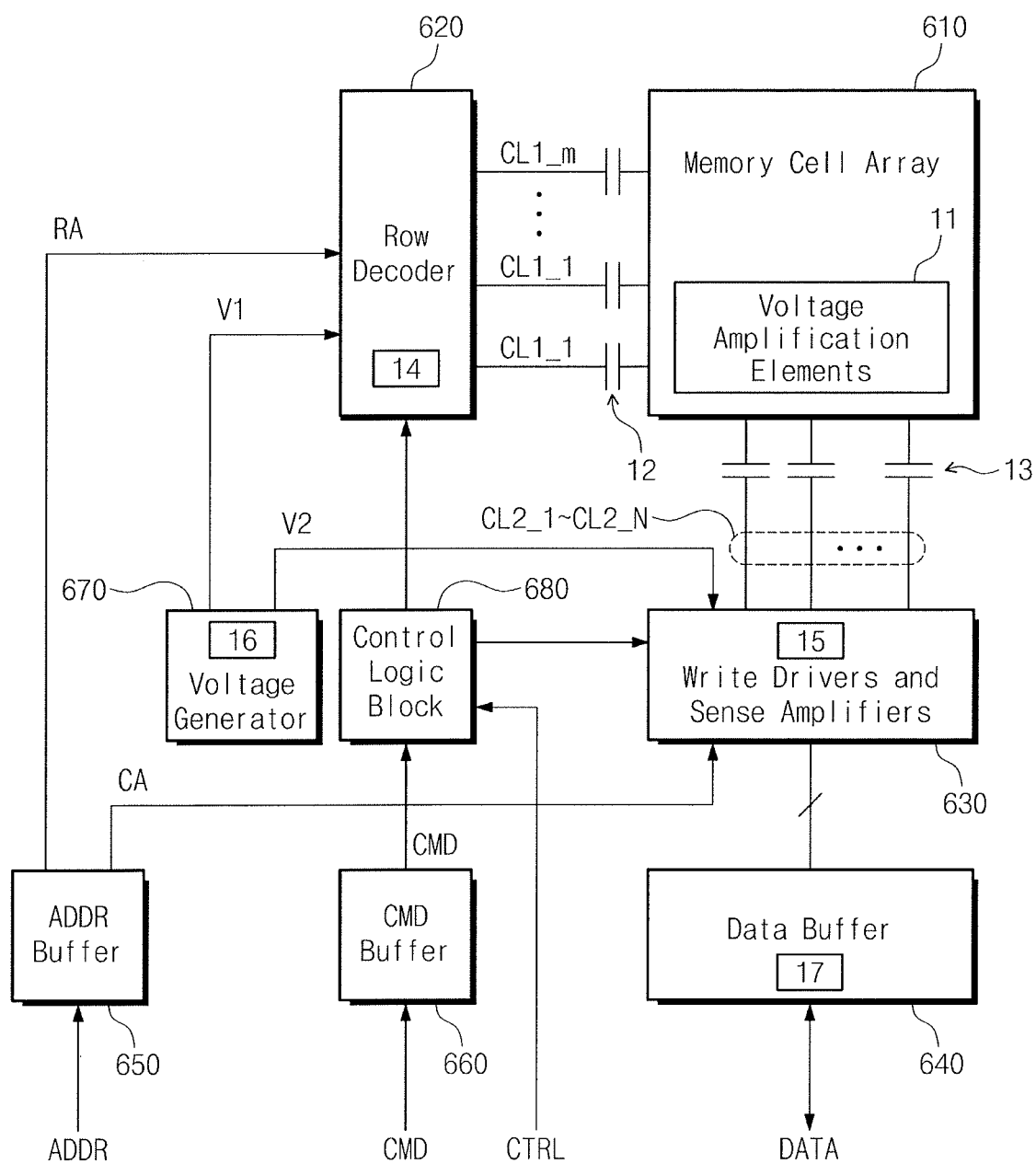
FIG. 14 illustrates a semiconductor memory device according to another embodiment.

FIG. 14 illustrates a semiconductor memory device 600 according to another embodiment. Referring to FIG. 14, the semiconductor memory device 600 includes a memory cell array 610, a row decoder 620, write drivers and sense amplifiers 630, a data buffer 640, an address buffer 650, a command buffer 660, a voltage generator 670, and a control logic block 680.

The memory cell array 610 may be implemented as described with reference to FIGS. 2 and 3 and FIG. 5 or 6. Each of the memory cells MC of the memory cell array 610 may be implemented to include the voltage amplification element 11 as described with reference to FIG. 4.

The first conductive lines CL1_1 to CL1_$m$ may be implemented to include the voltage amplification elements 12 as described with reference to FIG. 7. The second conductive lines CL2_1 to CL2_$n$ may be implemented to include the voltage amplification elements 13 as described with reference to FIG. 7.

The row decoder 620, the write drivers and sense amplifiers 630, the data buffer 640, the address buffer 650, the command buffer 660, the voltage generator 670, and the control logic block 680 may be implemented to be identical to the row decoder 120, the write drivers and sense amplifiers 130, the data buffer 140, the address buffer 150, the command buffer 160, the voltage generator 170, and the control logic block 180 described with reference to FIG. 1.

The row decoder 620 or the write drivers and sense amplifiers 630 may be implemented to include the voltage amplification elements 14 or 15 as described with reference to FIG. 8 or 9. The voltage generator 670 may be implemented to include the voltage amplification elements 16 as described with reference to FIGS. 10 and 11. The data buffer 640 may be implemented to include the voltage amplification elements 17 as described with reference to FIGS. 12 and 13.

Components of the semiconductor memory devices 100, 200, 300, 400, 500, and 600 are described above by using the terms "first", "second", "third", and the like. However, the terms "first", "second", "third", and the like may be used to distinguish components from each other and do not limit the present disclosure. For example, the terms "first", "second", "third", and the like do not involve an order or a numerical meaning of any form.

In the above embodiments, components according to embodiments are described by using blocks. The blocks may be implemented with various hardware devices, such as an integrated circuit, an application specific IC (ASCI), a field programmable gate array (FPGA), and a complex programmable logic device (CPLD), firmware driven in hardware devices, software such as an application, or a combination of a hardware device and software. Also, the blocks may include circuits or intellectual property (IP) implemented with semiconductor elements in an integrated circuit.

According to one or more embodiments, a voltage transferred to a gate of a transistor is amplified through a ferroelectric material. According to one or more embodiments, a voltage is amplified using a ferroelectric capacitor. Accordingly, as a swing of the voltage is increased while maintaining an operating voltage, a semiconductor memory device which secures stability within an improved operating speed or a particular operating speed is provided. Thus, a semiconductor memory device herein provides low power consumption while improving an operating speed by making increasing a swing of an operating voltage great while maintaining an operating voltage.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
a memory cell array including memory cells;
a row decoder connected to the memory cell array through first conductive lines;
write drivers and sense amplifiers connected to the memory cell array through second conductive lines;
a voltage generator to supply a first voltage to the row decoder and to supply a second voltage to the write drivers and sense amplifiers; and
a data buffer connected to the write drivers and sense amplifiers, the data buffer to transfer data between the write drivers and sense amplifiers and an external device,
wherein at least one of the row decoder, the write drivers and sense amplifiers, and the data buffer includes a first ferroelectric capacitor to amplify a voltage.

2. The semiconductor memory device as claimed in claim 1, wherein each of the memory cells includes:
a first transistor and a second transistor connected in series between a power node to which a power supply voltage is supplied and a ground node to which a ground voltage is supplied;
a third transistor and a fourth transistor connected in series between the power node and the ground node;
a fifth transistor having a first node connected in common to a gate of the third transistor and a gate of the fourth transistor, a second node connected to one of the second conductive lines, and a gate connected to one of the first conductive lines; and
a sixth transistor having a third node connected in common to a gate of the first transistor and a gate of the second transistor, a fourth node connected to another of the second conductive lines, and a gate connected to the one of the first conductive lines,
wherein a gate insulating layer of at least one transistor of the first to sixth transistors includes a ferroelectric material.

3. The semiconductor memory device as claimed in claim 1, wherein each of the memory cells includes:
a variable resistance element connected to one of the second conductive lines; and
a transistor having a first node connected to another of the second conductive lines, a second node connected to the variable resistance element, and a gate connected to one of the first conductive lines,
wherein a gate insulating layer of the transistor includes a ferroelectric material.

4. The semiconductor memory device as claimed in claim 3, wherein the variable resistance element includes at least one of a phase change material, a ferroelectric material, a resistive material, and a magnetic material.

5. The semiconductor memory device as claimed in claim 1, wherein each of the memory cells includes:
a capacitor connected to one of the second conductive lines;
a transistor having a first node connected to another of the second conductive lines, a second node connected to the capacitor, and a gate connected to one of the first conductive lines,
wherein a gate insulating layer of the transistor includes a ferroelectric material.

6. The semiconductor memory device as claimed in claim 1, wherein each of the first conductive lines or the second conductive lines includes a second ferroelectric capacitor.

7. The semiconductor memory device as claimed in claim 1, wherein the row decoder includes:
a first transistor connected between one of the first conductive lines and an internal line corresponding to the one of the first conductive lines; and
a second transistor and a first ferroelectric capacitor connected in series between the one of the first conductive lines and the internal line,
wherein the second transistor and the first ferroelectric capacitor are connected in parallel with the first transistor, and wherein the first and second transistors are controlled by complementary signals.

8. The semiconductor memory device as claimed in claim 1, wherein the write drivers and sense amplifiers include:
a first transistor connected between one of the second conductive lines and an internal line corresponding to the one of the second conductive lines; and
a second transistor and a first ferroelectric capacitor connected in series between the one of the second conductive lines and the internal line,
wherein the second transistor and the first ferroelectric capacitor are connected in parallel with the first transistor, and
wherein the first and second transistors are controlled by complementary signals.

9. The semiconductor memory device as claimed in claim 1, wherein the voltage generator includes:
a first transistor connected between a voltage generation node and a voltage output node; and
a second transistor and a first ferroelectric capacitor connected in series between the voltage generation node and the voltage output node, wherein
the second transistor and the first ferroelectric capacitor are connected in parallel with the first transistor,
the first and second transistors are controlled by complementary signals, and
a voltage of the voltage output node is transferred to the row decoder or the write drivers and sense amplifiers as the first voltage or the second voltage.

10. The semiconductor memory device as claimed in claim 1, wherein the data buffer includes:
a first pad to be connected with an external device;
a first receiver to amplify a first signal received from the first pad to generate a second signal; and
the first ferroelectric capacitor connected between the first pad and the first receiver.

11. The semiconductor memory device as claimed in claim 10, wherein the data buffer further includes:
a first transmitter to amplify an internal signal to generate a third signal, and to transfer the third signal to the first pad; and
a second ferroelectric capacitor connected between the first pad and the first transmitter.

12. The semiconductor memory device as claimed in claim 11, wherein the data buffer includes:
a second pad to be connected with the external device;
a second receiver to amplify a fourth signal received from the second pad to generate a fifth signal;
a third ferroelectric capacitor connected between the second receiver and the second pad; and
a flip-flop to convert the second signal of the first receiver to a digital value in synchronization with the fifth signal of the second receiver.

13. The semiconductor memory device as claimed in claim 12, wherein the data buffer further includes a deserializer to deserialize outputs of the flip-flop so as to be transferred to the write drivers and sense amplifiers.

14. The semiconductor memory device as claimed in claim 11, wherein the data buffer further includes:
a second pad to be connected with the external device;
a second receiver to amplify a fourth signal received from the second pad to generate a fifth signal;
a third ferroelectric capacitor connected between the second pad and the second receiver;
a signal generator to generate a sixth signal from the fifth signal of the second receiver; and
a flip-flop to transfer the internal signal to the first transmitter in synchronization with the sixth signal.

15. The semiconductor memory device as claimed in claim 14, wherein the data buffer further includes a serializer to serialize signals transferred from the write drivers and sense amplifiers so as to be transferred to the flip-flop.

16. The semiconductor memory device as claimed in claim 14, wherein the data buffer further includes:
a third pad to be connected with the external device;
a second transmitter to amplify the sixth signal of the signal generator to generate a seventh signal, and to transfer the seventh signal to the third pad; and
a fourth ferroelectric capacitor connected between the third pad and the second transmitter.

17. A semiconductor memory device, comprising:
a memory cell array including memory cells;
a row decoder connected to the memory cell array through first conductive lines;
write drivers and sense amplifiers connected to the memory cell array through second conductive lines;
a voltage generator to supply a first voltage to the row decoder and to supply a second voltage to the write drivers and sense amplifiers; and
a data buffer connected to the write drivers and sense amplifiers, the data buffer to transfer data between the write drivers and sense amplifiers and an external device,
wherein at least one of the row decoder, the write drivers and sense amplifiers, the voltage generator, and the data buffer includes a first ferroelectric capacitor to amplify a voltage, and
wherein the voltage generator includes:
a first transistor connected between a voltage generation node and a voltage output node; and
a second transistor and a first ferroelectric capacitor connected in series between the voltage generation node and the voltage output node, wherein
the second transistor and the first ferroelectric capacitor are connected in parallel with the first transistor,
the first and second transistors are controlled by complementary signals, and
a voltage of the voltage output node is transferred to the row decoder or the write drivers and sense amplifiers as the first voltage or the second voltage.

18. A semiconductor memory device, comprising:
a memory cell array including memory cells;
a row decoder connected to the memory cell array through first conductive lines;
write drivers and sense amplifiers connected to the memory cell array through second conductive lines;
a voltage generator to supply a first voltage to the row decoder and to supply a second voltage to the write drivers and sense amplifiers; and
a data buffer connected to the write drivers and sense amplifiers, the data buffer to transfer data between the write drivers and sense amplifiers and an external device,
wherein at least one of the row decoder, the write drivers and sense amplifiers, the voltage generator, and the data buffer includes a first ferroelectric capacitor to amplify a voltage,
wherein each of the first conductive lines or the second conductive lines includes a second ferroelectric capacitor.

* * * * *